United States Patent
Cheng et al.

(10) Patent No.: US 12,088,294 B2
(45) Date of Patent: Sep. 10, 2024

(54) VOLTAGE LEVEL SHIFTER AND OPERATION METHOD THEREOF

(71) Applicant: eMemory Technology Inc., Hsinchu (TW)

(72) Inventors: Yu-Hsuan Cheng, Hsinchu County (TW); Cheng-Heng Chung, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 18/185,399

(22) Filed: Mar. 17, 2023

(65) Prior Publication Data

US 2023/0327671 A1  Oct. 12, 2023

Related U.S. Application Data

(60) Provisional application No. 63/329,491, filed on Apr. 11, 2022.

(51) Int. Cl.
*H03K 19/0185* (2006.01)
*G11C 16/14* (2006.01)
*G11C 16/26* (2006.01)
*H03K 3/037* (2006.01)
*H10B 41/10* (2023.01)
*H10B 41/35* (2023.01)

(52) U.S. Cl.
CPC ..... *H03K 19/018521* (2013.01); *G11C 16/14* (2013.01); *G11C 16/26* (2013.01); *H03K 3/037* (2013.01); *H10B 41/10* (2023.02); *H10B 41/35* (2023.02)

(58) Field of Classification Search
CPC .............................................. H03K 19/018521
See application file for complete search history.

(56) References Cited

U.S. PATENT DOCUMENTS

| | | | |
|---|---|---|---|
| 7,355,447 B2* | 4/2008 | Wood | H03K 19/018521 326/86 |
| 7,755,394 B2* | 7/2010 | Froehnel | H03K 19/018521 326/80 |
| 9,257,190 B2 | 2/2016 | Lai | |
| 2005/0248381 A1 | 11/2005 | Kubotai et al. | |
| 2017/0149434 A1 | 5/2017 | Bianchi et al. | |
| 2018/0145690 A1 | 5/2018 | Zhu et al. | |

FOREIGN PATENT DOCUMENTS

| | | |
|---|---|---|
| CN | 111969997 A | 11/2020 |
| TW | I277276 B | 3/2007 |

* cited by examiner

*Primary Examiner* — Patrick O Neill
(74) *Attorney, Agent, or Firm* — CKC & Partners Co., LLC

(57) ABSTRACT

A voltage level shifter includes an input transistor, a control circuit, a reset circuit, and a keeper circuit. The input transistor is configured to receive an input voltage and a first reference voltage. The control circuit is configured to generate a pulse voltage according to the input voltage and one of a node voltage, an output voltage, and an inversion input voltage. The reset circuit is configured to receive the first reference voltage and a second reference voltage and controlled by the pulse voltage. The reset circuit is coupled to the input transistor at a first node where the node voltage is generated. The keeper circuit is coupled to the first node and configured to generate the output voltage according to the node voltage, the first reference voltage, the second reference voltage, and the output voltage.

19 Claims, 8 Drawing Sheets

VOLTAGE LEVEL SHIFTER AND OPERATION METHOD THEREOF

RELATED APPLICATIONS

This application claims priority to U.S. Provisional Application Ser. No. 63/329,491, filed Apr. 11, 2022, which is herein incorporated by reference.

BACKGROUND

Technical Field

The present disclosure relates to level shifting technology. More particularly, the present disclosure relates to a high-speed voltage level shifter and an operation method thereof.

Description of Related Art

With developments of technology, various circuits are developed. For example, voltage level shifters have been applied to various circuitries, and the voltage level shifters can convert an input voltage with a smaller voltage range into an output voltage with a larger voltage range. In some related arts, the output voltage changes slowly when the input voltage changes.

SUMMARY

Some aspects of the present disclosure are to a voltage level shifter. The voltage level shifter includes an input transistor, a control circuit, a reset circuit, and a keeper circuit. The input transistor is configured to receive an input voltage and a first reference voltage. The control circuit is configured to generate a pulse voltage according to the input voltage and one of a node voltage, an output voltage, and an inversion input voltage to be disabled when the input voltage changes from a first voltage to a second voltage such that the node voltage changes from the second reference voltage to the first reference voltage, and controlled by the pulse voltage to be enabled when the input voltage changes from the second voltage to the first voltage such that the node voltage changes from the first reference voltage to the second reference voltage. The reset circuit is configured to receive the first reference voltage and a second reference voltage and controlled by the pulse voltage. The reset circuit is coupled to the input transistor at a first node where the node voltage is generated. The keeper circuit is coupled to the first node and configured to generate the output voltage according to the node voltage, the first reference voltage, the second reference voltage, and the output voltage.

Some aspects of the present disclosure are to provide an operation method for a voltage level shifter. The operation method includes following operations: when the input voltage changes from the first voltage to the second voltage, turning on the input transistor by the input voltage such that the node voltage is pulled by the first reference voltage and the output voltage is pulled by the second reference voltage; when the input voltage changes from the second voltage to the first voltage, generating the pulse voltage to turn on a first transistor in the reset circuit such that the node voltage is pulled by the second reference voltage and the output voltage is pulled by the first reference voltage; and turning off the first transistor by the pulse voltage.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
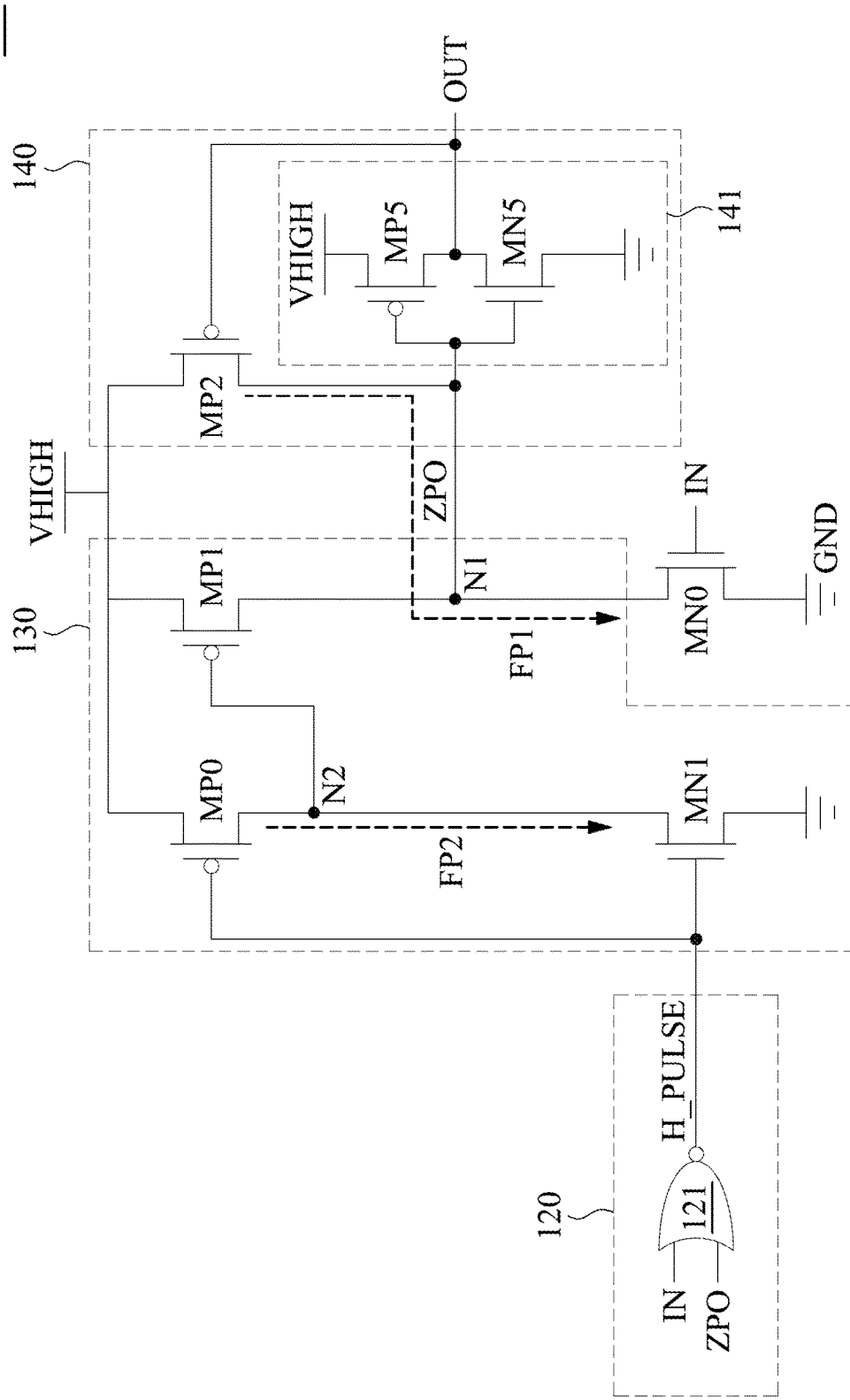
FIG. 1 is a schematic diagram illustrating a voltage level shifter according to some embodiments of the present disclosure.

Reference is made to FIG. 1. FIG. 1 is a schematic diagram illustrating a voltage level shifter 100 according to some embodiments of the present disclosure. The voltage level shifter 100 is used to convert an input voltage IN with a smaller voltage range into an output voltage OUT with a larger voltage range.

As illustrated in FIG. 1, the voltage level shifter 100 includes an input transistor MN0, a control circuit 120, a reset circuit 130, and a keeper circuit 140.

A first terminal of the input transistor MN0 receives a ground voltage GND (e.g., a first reference voltage), a second terminal of the input transistor MN0 is coupled to a node N1, and a control terminal of the input transistor MN0 receives the input voltage IN. In other words, the input transistor MN0 is controlled to be turned on or off by the input voltage IN. In this example, the input transistor MN0 is implemented by an N-type transistor.

The control circuit 120 generates a pulse voltage H_PULSE according to the input voltage IN and a node voltage ZPO at the node N1. As illustrated in FIG. 1, the control circuit 120 includes a NOR gate 121. A first input terminal of the NOR gate 121 receives the input voltage IN, and a second input terminal of the NOR gate 121 receives a node voltage ZPO at the node N1. The NOR gate 121 performs the NOR operation on the input voltage IN and the node voltage ZPO to generate the pulse voltage H_PULSE at an output terminal of the NOR gate 121.

The reset circuit 130 receives the ground voltage GND and a power voltage VHIGH (e.g., a second reference voltage higher than the first reference voltage). In addition, the reset circuit 130 is controlled by the pulse voltage H_PULSE. As illustrated in FIG. 1, the reset circuit 130 includes a transistor MN1, a transistor MP0, and a transistor MP1. A first terminal of the transistor MN1 receives the ground voltage GND, a second terminal of the transistor MN1 is coupled to a first terminal of the transistor MP0, and a control terminal of the transistor MN1 receives the pulse voltage H_PULSE. In other words, the transistor MN1 is controlled to be turned on or off by the pulse voltage H_PULSE. A second terminal of the transistor MP0 receives the power voltage VHIGH, and a control terminal of the transistor MP0 receives the pulse voltage H_PULSE. In other words, the transistor MP0 is also controlled to be turned on or off by the pulse voltage H_PULSE. A first terminal of the transistor MP1 is coupled to the second terminal of the input transistor MN0 at the node N1, a second terminal of the transistor MP1 receives the power voltage VHIGH, and a control terminal of the transistor MP1 is coupled to the second terminal of the transistor MN1. In other words, the transistor MP1 is controlled to be turned on or off by a voltage at a node N2 between the transistor MN1 and the transistor MP0 (e.g., a drain voltage of the transistor MN1). In this example, the transistor MN1 is implemented by an N-type transistor, and the transistor MP0 and the transistor MP1 are implemented by P-type transistors.

The keeper circuit 140 is coupled to the node N1 and generates the output voltage OUT according to the node voltage ZPO, the ground voltage GND, the power voltage VHIGH, and the output voltage OUT. As illustrated in FIG. 1, the keeper circuit 140 includes a transistor MP2 and an inverter 141. A first terminal of the transistor MP2 is coupled to the node N1, a second terminal of the transistor MP2 receives the power voltage VHIGH, and a control terminal of the transistor MP2 receives the output voltage OUT. In other words, the transistor MP2 is controlled to be turned on or off by the output voltage OUT. The inverter 141 generates the output voltage OUT according to the node voltage ZPO, the ground voltage GND, and the power voltage VHIGH. In other words, the inverter 141 inverts the node voltage ZPO. As illustrated in FIG. 1, the inverter 141 includes a transistor MN5 and a transistor MP5. A first terminal of the transistor MN5 receives the ground voltage GND, a second terminal of the transistor MN5 is coupled to a first terminal of the transistor MP5, and a control terminal of the transistor MN5 receives the node voltage ZPO. A second terminal of the transistor MP5 receives the power voltage VHIGH, and a control terminal of the transistor MP5 receives the node voltage ZPO. In other words, the transistor MN5 and the transistor MP5 are controlled to be turned on or off by the node voltage ZPO to generate the output voltage OUT. In this example, the transistor MN5 is implemented by an N-type transistor, and the transistor MP2 and the transistor MP5 are implemented by P-type transistors.

Figure 2:
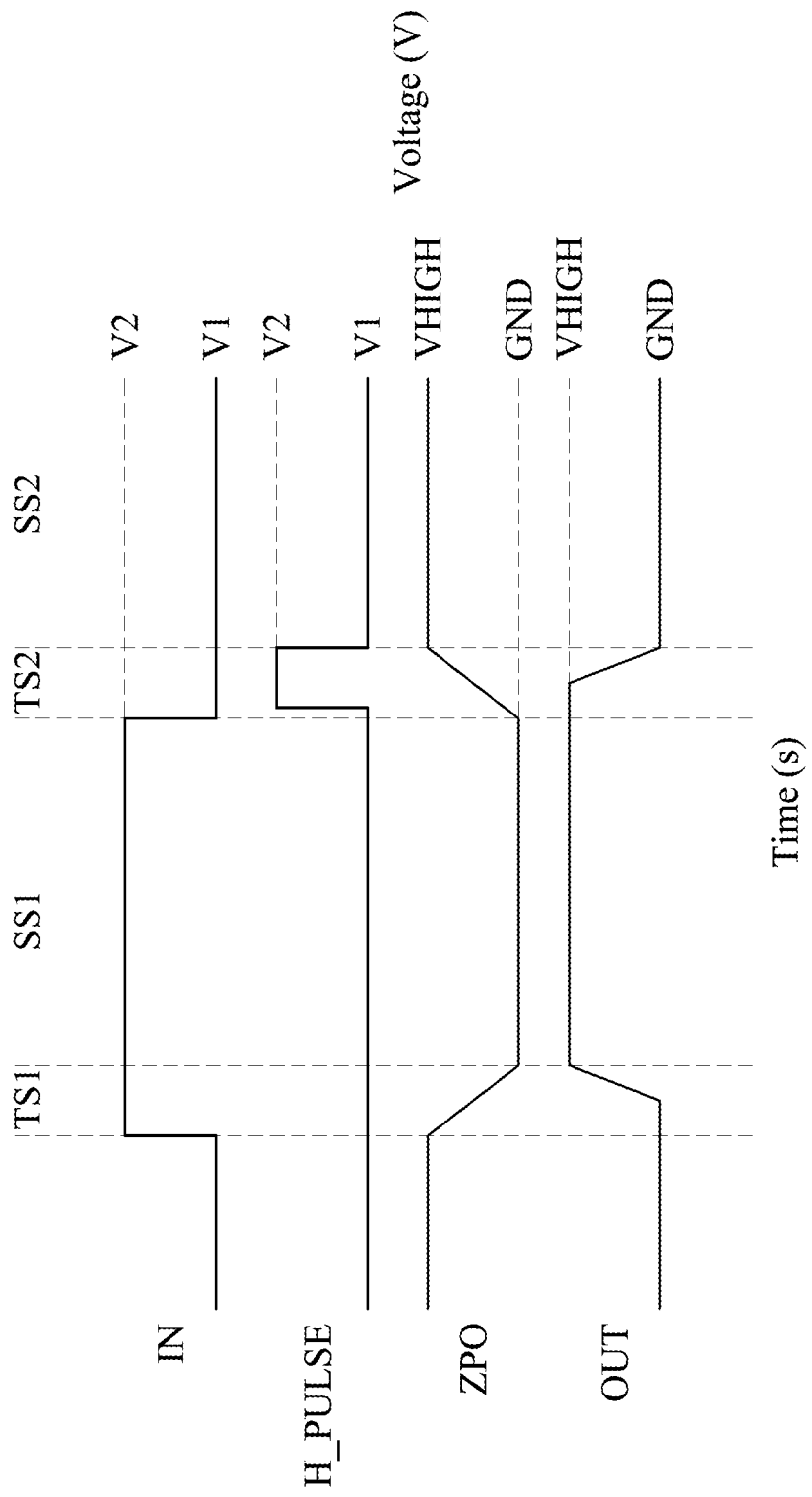
FIG. 2 is a waveform diagram illustrating voltages in the voltage level shifter in FIG. 1 according to some embodiments of the present disclosure.

References are made to FIG. 1 and FIG. 2. FIG. 2 is a waveform diagram illustrating voltages in the voltage level shifter 100 in FIG. 1 according to some embodiments of the present disclosure.

As illustrated in FIG. 2, before a transition duration TS1, the output voltage OUT is at the ground voltage GND, and the transistor MP2 is turned on according to the control of the output voltage OUT. The transistor MP2 conducts the power voltage VHIGH, and thus the node voltage ZPO is at the power voltage VHIGH, so as to turn on the transistor MN5 to keep the output voltage OUT at the ground voltage GND. In addition, before the transition duration TS1, the input voltage IN is at a voltage V1 (e.g., low logic level) and the transistor MN0 is turned off, and thus the node voltage ZPO can be kept at the power voltage VHIGH to keep the output voltage OUT at the ground voltage GND. The transistor MP2 is turned on by the output voltage OUT.

Then, in the transition duration TS1 (i.e. the reset circuit 130 is disabled), the input voltage IN increases from the voltage V1 to a voltage V2 (e.g., high logic level). The input transistor MN0 is turned on by the input voltage IN. Since the transistor MP2 and the input transistor MN0 are turned on, there is a pull-up/pull-down fighting path FP1 between the transistor MP2 and the transistor MN0. The input transistor MN0 can be designed to be stronger than the transistor MP2. To be more specific, in some embodiments, a channel width to channel length ratio of the input transistor MN0 is designed to be larger than a channel width to channel length ratio of the transistor MP2. For example, the channel width to channel length ratio of the input transistor MN0 can be 2-6 times of the channel width to channel length ratio of the transistor MP2. In some other embodiments, a thickness of the gate oxide of the MN0 is designed to be thinner than a thickness of the gate oxide of the MP2. Since the input transistor MN0 is turned on by the input voltage IN, the node voltage ZPO is rapidly pulled down by the ground voltage GND through the turned-on input transistor MN0. Accordingly, the output voltage OUT generated by the inverter 141 is rapidly pulled up by the power voltage VHIGH.

In a stable duration SS1, when the output voltage OUT increases to the power voltage VHIGH, the transistor MP2 is rapidly turned off and there is no quiescent current flowing through the pull-up/pull-down fighting path FP1. Thus, the node voltage ZPO is kept at the ground voltage GND, and the input voltage IN is kept at the voltage V2, so that the pulse voltage H_PULSE which is a result of the NOR operation on the input voltage IN with the voltage V2 and the node voltage ZPO with the ground voltage GND is kept at the voltage V1. Since the pulse voltage H_PULSE is kept at the voltage V1, the transistor MN1 is turned off and the transistor MP0 is turned on. The turned-on transistor MP0 conducts the power voltage VHIGH to turn off the transistor MP1. Thus, the node voltage ZPO is not pulled up to power voltage VHIGH through the transistor MP1. Accordingly, the node voltage ZPO is kept at the ground voltage GND, the output voltage OUT is kept at the power voltage VHIGH, and the power voltage VHIGH is higher than the voltage V2.

In a transition duration TS2 (i.e. the reset circuit 130 is enabled), the input voltage IN decreases from the voltage V2 to the voltage V1. Since the input voltage IN and the node voltage ZPO have the low logic level at the beginning of the transition duration TS2, the pulse voltage H_PULSE increases from the voltage V1 to the voltage V2 to turn on the transistor MN1 and there is a pull-up/pull-low fighting path FP2 between the transistor MP0 and the transistor MN1. The input transistor MN1 can be designed to be stronger than the transistor MP0. To be more specific, in some embodiments, a channel width to channel length ratio of the input transistor MN1 is designed to be larger than a channel width to channel length ratio of the transistor MP0. For example, the channel width to channel length ratio of the input transistor MN1 can be 2-6 times of the channel width to channel length ratio of the transistor MP0. In some other embodiments, a thickness of the gate oxide of the MN1 is designed to be thinner than a thickness of the gate oxide of the MP0. Thus, the second terminal of the transistor MN1 is rapidly pulled down by the ground voltage GND through the turned-on transistor MN1. Since the second terminal of the transistor MN1 (e.g., the control terminal of the transistor MP1) is rapidly pulled down, the transistor MP1 is rapidly turned on and the node voltage ZPO is rapidly pulled up by the power voltage VHIGH through the turned-on transistor MP1. Accordingly, the output voltage OUT generated by the inverter 141 is rapidly pulled down by the ground voltage GND.

In a stable duration SS2, when the node voltage ZPO increases to the power voltage VHIGH, the pulse voltage H_PULSE rapidly decreases from the voltage V2 to the voltage V1 to turn off the transistor MN1 and there is no quiescent current flowing through the pull-up/pull-down fighting path FP2. And the transistor MP0 is turned on according to the pulse voltage H_PULSE which is at the voltage V1 to conduct the power voltage VHIGH to turn off the transistor MP1. Thus, the input voltage IN is kept at the voltage V1, the pulse voltage H_PULSE is kept at the voltage V1, the node voltage ZPO is kept at the power voltage VHIGH, and the output voltage OUT is kept at the ground voltage GND.

In some voltage level shifters in related arts, the transition speed of the output voltage from the high logic level to the low logic level is very different from the transition speed of the output voltage from the low logic level to the high logic level. For example, the transition speed of the output voltage from the high logic level to the low logic level is very slow.

Compared to the aforementioned related approaches, in the present disclosure, the transition speed of the output voltage from the high logic level to the low logic level is very close to the transition speed of the output voltage from the low logic level to the high logic level. In other words, both of the transition speed of the output voltage from the high logic level to the low logic level and the transition speed of the output voltage from the low logic level to the high logic level are fast.

In addition, compared to some related arts, the reset circuit 130 in the present disclosure has fewer transistors. Thus, the circuit area of the present disclosure can be smaller. Furthermore, when the sizes of the transistors in the reset circuit 130 need to be adjusted, fewer transistors need to be adjusted.

Figure 3:
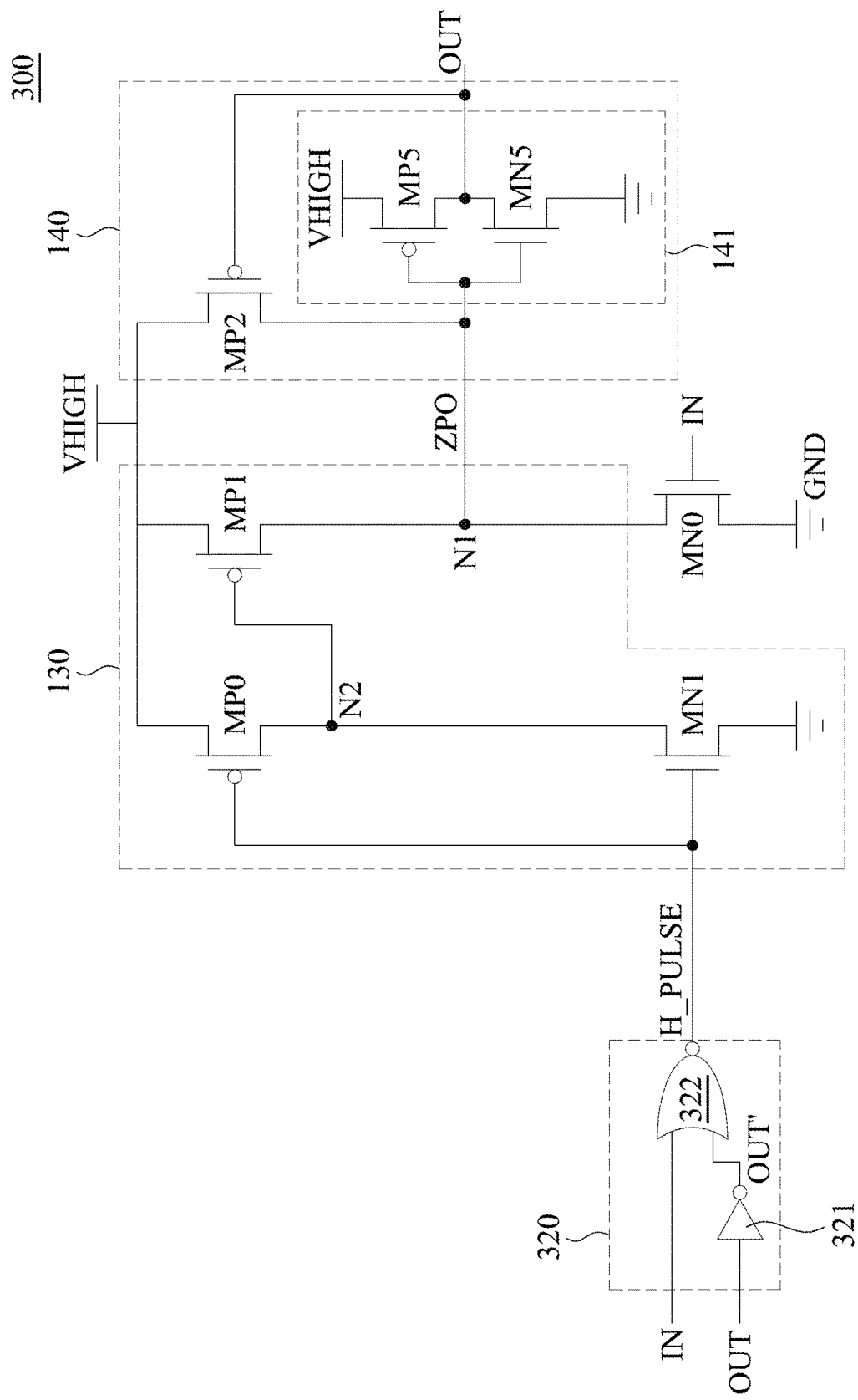
FIG. 3 is a schematic diagram illustrating a voltage level shifter according to some embodiments of the present disclosure.

Reference is made to FIG. 3. FIG. 3 is a schematic diagram illustrating a voltage level shifter 300 according to some embodiments of the present disclosure. One of major differences between the voltage level shifter 300 and the voltage level shifter 100 is that the voltage level shifter 300 includes a control circuit 320 instead of the control circuit 120.

The control circuit 320 generates the pulse voltage H_PULSE according to the input voltage IN and the output voltage OUT. As illustrated in FIG. 3, the control circuit 320 includes an inverter 321 and a NOR gate 322. An input terminal of the inverter 321 receives the output voltage OUT to generate an inversion output voltage OUT' according to the output voltage OUT. A first input terminal of the NOR gate 322 receives the input voltage IN, and a second input terminal of the NOR gate 322 receives the inversion output voltage OUT'. The NOR gate 322 performs the NOR operation on the input voltage IN and the inversion output voltage OUT' to generate the pulse voltage H_PULSE at an output terminal of the NOR gate 322.

As illustrated in FIG. 2, the changing trend of the output voltage OUT is almost the inverse of the changing trend of the node voltage ZPO. Thus, in FIG. 3, the changing trend of the inversion output voltage OUT' is almost identical to the changing trend of the node voltage ZPO. Thus, the operations of the control circuit 320 are similar to the control circuit 120 such that the operations of the voltage level shifter 300 are similar to the voltage level shifter 100.

Figure 4:
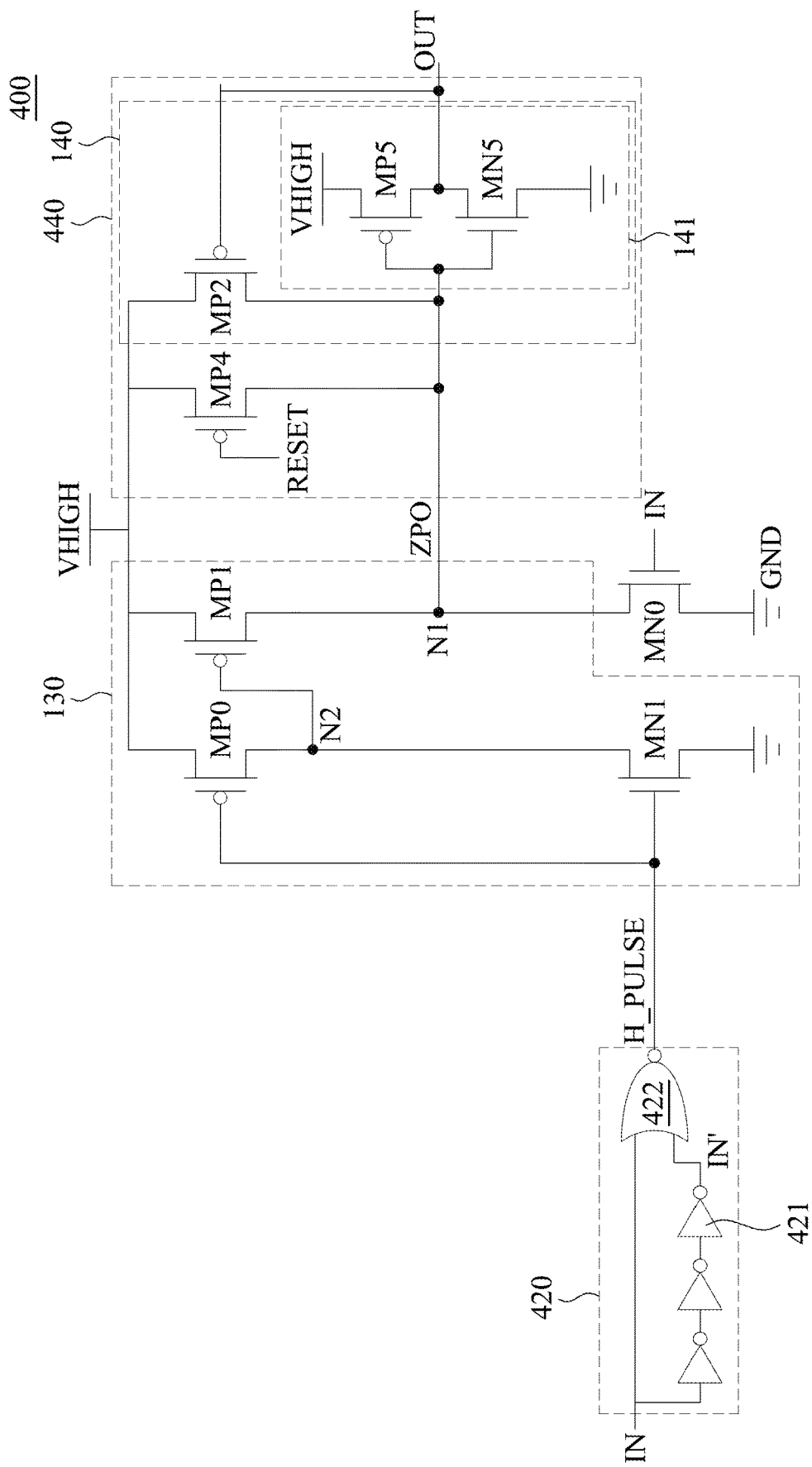
FIG. 4 is a schematic diagram illustrating a voltage level shifter according to some embodiments of the present disclosure.

Reference is made to FIG. 4. FIG. 4 is a schematic diagram illustrating a voltage level shifter 400 according to some embodiments of the present disclosure. One of major differences between the voltage level shifter 400 and the voltage level shifter 100 is that the voltage level shifter 400 includes a control circuit 420 instead of the control circuit 120. Another one of major differences between the voltage level shifter 400 and the voltage level shifter 100 is that the voltage level shifter 400 includes a keeper circuit 440 including the keeper circuit 140 in FIG. 1 and a reset transistor MP4. In this example, the transistor MP4 is implemented by a P-type transistor.

The control circuit 420 generates the pulse voltage H_PULSE according to the input voltage IN and an inversion input voltage IN'. The control circuit 420 is implemented by a pulse generator. As illustrated in FIG. 4, the control circuit 420 includes a plurality of inverters 421 and a NOR gate 422. The inverters 421 receive the input voltage IN to generate the inversion input voltage IN' according to the input voltage IN. A first input terminal of the NOR gate 422 receives the input voltage IN, and a second input terminal of the NOR gate 422 receives the inversion input voltage IN'. The NOR gate 422 performs the NOR operation on the input voltage IN and the inversion input voltage IN' to generate the pulse voltage H_PULSE at an output terminal of the NOR gate 422. The inverters 421 can contribute a time delay such that the pulse voltage H_PULSE change from the low logic level to the high logic level after the time delay.

As illustrated in FIG. 2, the changing trend of the input voltage IN is almost the inverse of the changing trend of the node voltage ZPO. Similarly, in FIG. 4, the changing trend of the inversion input voltage IN' is almost identical to the changing trend of the node voltage ZPO. Thus, the operations of the control circuit 420 are similar to the control circuit 120 such that the operations of the voltage level shifter 400 are similar to the voltage level shifter 100.

In addition, a first terminal of the reset transistor MP4 is coupled to the node N1, a second terminal of the reset transistor MP4 receives the power voltage VHIGH, and a control terminal of the reset transistor MP4 receives a reset signal RESET. In other words, the reset transistor MP4 is controlled to be turned on or off by the reset signal RESET. In this example, the reset transistor MP4 is implemented by a P-type transistor. Before the voltage level shifter 400 starts to operate (i.e., before the transition duration TS1), the reset signal RESET has a low logic level. Thus, the reset transistor MP4 is turned on, and the node voltage ZPO is pulled up to the power voltage VHIGH through the turned-on reset transistor MP4. Accordingly, the output voltage OUT is pulled down to the ground voltage GND. Thus, the output voltage OUT would not be in unknown state.

Figure 5:
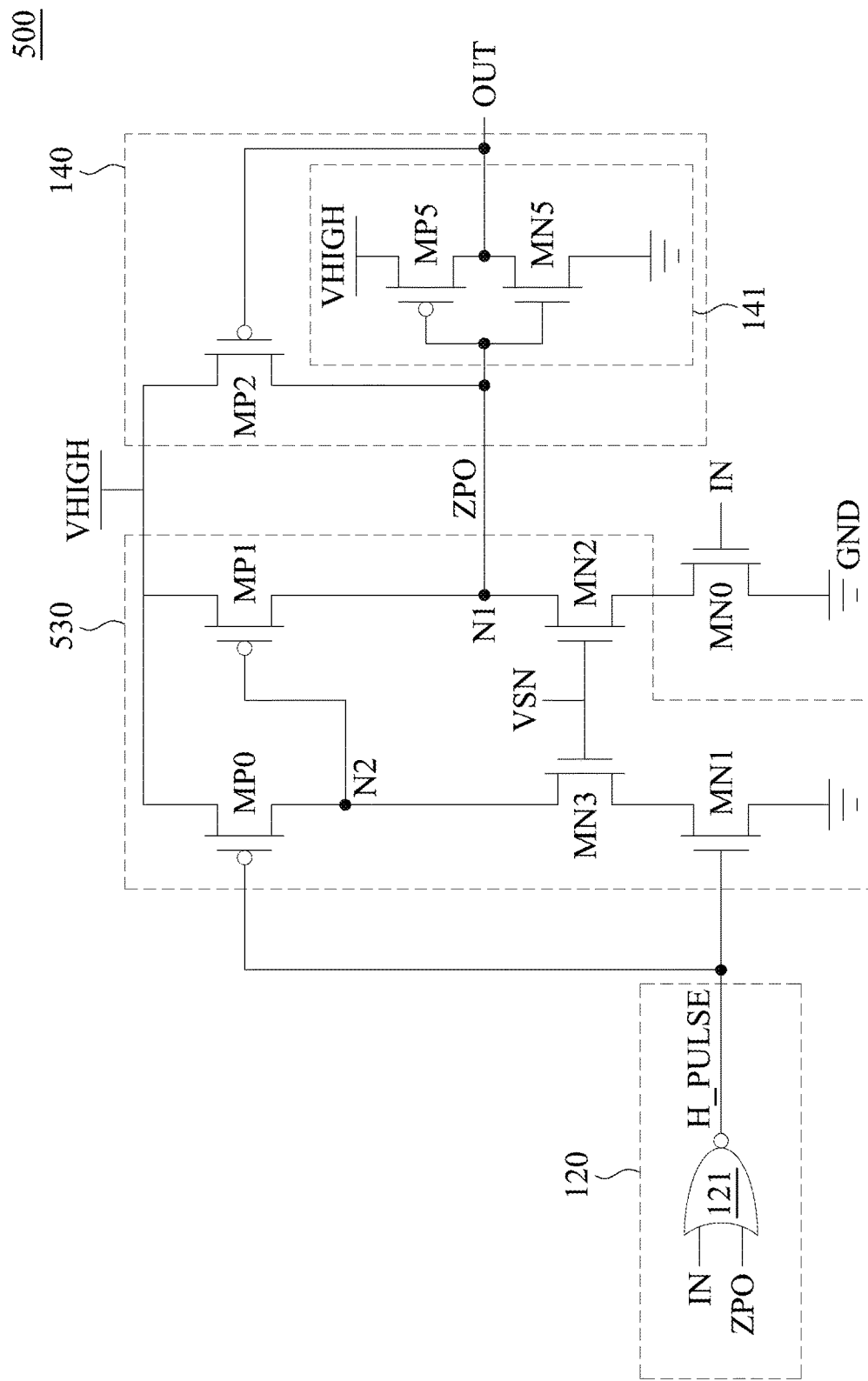
FIG. 5 is a schematic diagram illustrating a voltage level shifter according to some embodiments of the present disclosure.

Reference is made to FIG. 5. FIG. 5 is a schematic diagram illustrating a voltage level shifter 500 according to some embodiments of the present disclosure. One of major differences between the voltage level shifter 500 and the voltage level shifter 100 is that a reset circuit 530 further includes a transistor MN2 and a transistor MN3. In this example, the transistor MN2 and the transistor MN3 are implemented by N-type transistors.

As illustrated in FIG. 5, the transistor MN2 is coupled between the transistor MP1 and the transistor MN0, and the transistor MN3 is coupled between the transistor MP0 and the transistor MN1. Control terminals of the transistor MN2 and the transistor MN3 receive a bias voltage VSN. The transistor MN2 is used to prevent the voltage at the second terminal of the transistor MN0 (e.g., the drain voltage of the transistor MN0) from being too high. Similarly, the transistor MN3 is used to prevent the voltage at the second terminal of the transistor MN1 (e.g., the drain voltage of the transistor MN1) from being too high, such that the transistors MN0, and MN1 can operate in safe operating area (SOA), and the transistors MN0, and MN1 would not be damaged.

Figure 6:
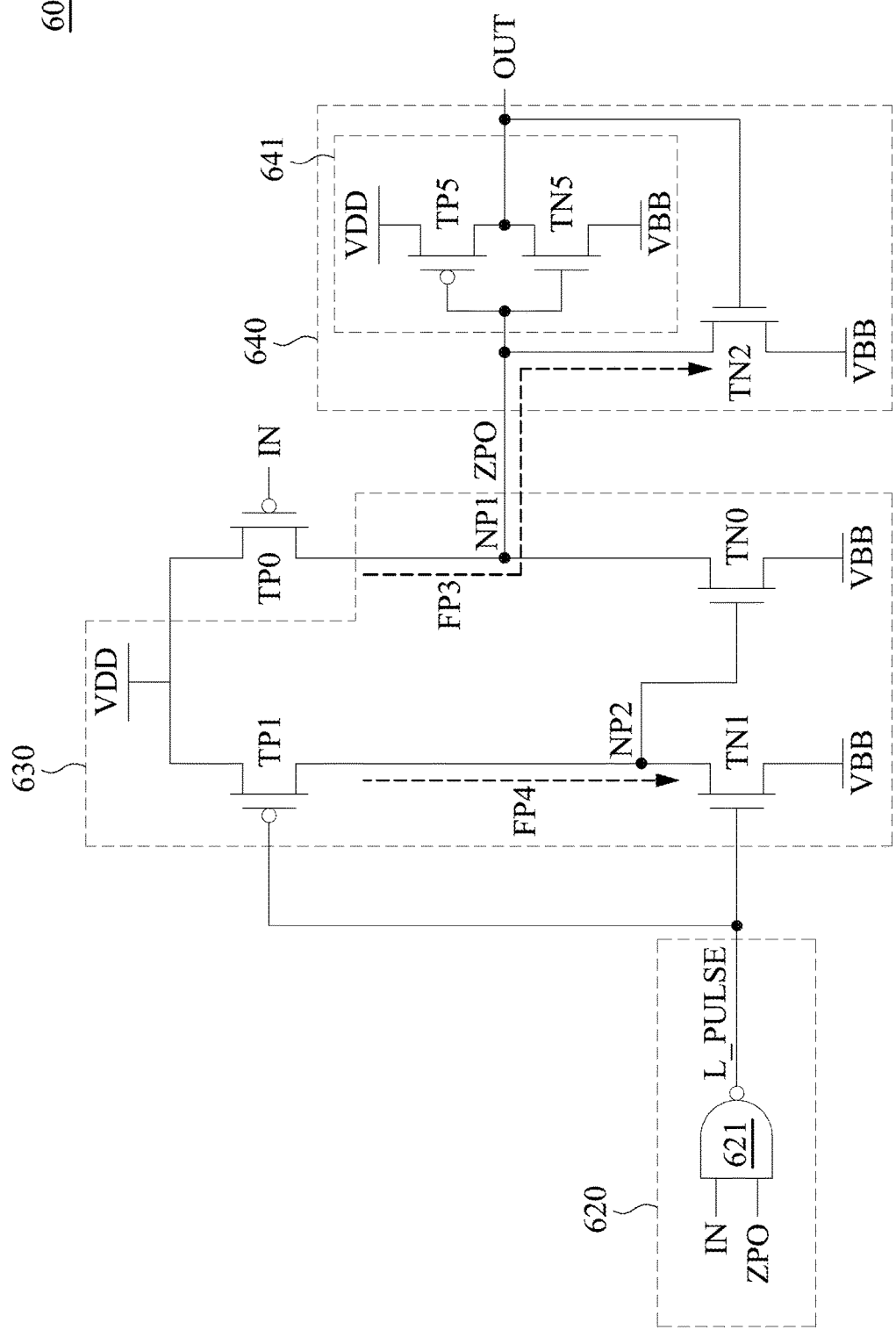
FIG. 6 is a schematic diagram illustrating a voltage level shifter according to some embodiments of the present disclosure.

Reference is made to FIG. 6. FIG. 6 is a schematic diagram illustrating a voltage level shifter 600 according to some embodiments of the present disclosure.

As illustrated in FIG. 6, the voltage level shifter 600 includes an input transistor TP0, a control circuit 620, a reset circuit 630, and a keeper circuit 640.

A first terminal of the input transistor TP0 receives a reference voltage VDD (e.g., a first reference voltage), a second terminal of the input transistor TP0 is coupled to a node NP1, and a control terminal of the input transistor TP0 receives an input voltage IN. In other words, the input transistor TP0 is controlled to be turned on or off by the input voltage IN. In this example, the input transistor TP0 is implemented by a P-type transistor.

The control circuit 620 generates a pulse voltage L_PULSE according to the input voltage IN and a node voltage ZPO at the node NP1. As illustrated in FIG. 6, the control circuit 620 includes a NAND gate 621. A first input terminal of the NAND gate 621 receives the input voltage IN, and a second input terminal of the NAND gate 621 receives a node voltage ZPO at the node NP1. The NAND gate 621 performs the NAND operation on the input voltage IN and the node voltage ZPO to generate the pulse voltage L_PULSE at an output terminal of the NAND gate 621.

The reset circuit 630 receives the reference voltage VDD and a reference voltage VBB (e.g., a second reference voltage lower than the first reference voltage). In addition, the reset circuit 630 is controlled by the pulse voltage L_PULSE. As illustrated in FIG. 6, the reset circuit 630 includes a transistor TP1, a transistor TN1, and a transistor TN0. A first terminal of the transistor TP1 receives the reference voltage VDD, a second terminal of the transistor TP1 is coupled to a first terminal of the transistor TN1, and a control terminal of the transistor TP1 receives the pulse voltage L_PULSE. In other words, the transistor TP1 is controlled to be turned on or off by the pulse voltage L_PULSE. A second terminal of the transistor TN1 receives the reference voltage VBB, and a control terminal of the transistor TN1 receives the pulse voltage L_PULSE. In other words, the transistor TN1 is also controlled to be turned on or off by the pulse voltage L_PULSE. A first terminal of the transistor TN0 is coupled to the second terminal of the input transistor TP0 at the node NP1, a second terminal of the transistor TN0 receives the reference voltage VBB, and a control terminal of the transistor TN0 is coupled to the second terminal of the transistor TP1. In other words, the transistor TN0 is controlled to be turned on or off by a voltage at a node NP2 between the transistor TP1 and the transistor TN1 (i.e., a drain voltage of the transistor TP1). In this example, the transistor TP1 is implemented by a P-type transistor, and the transistor TN1 and the transistor TN0 are implemented by N-type transistors.

The keeper circuit 640 is coupled to the node NP1 and generates the output voltage OUT according to the node voltage ZPO, the reference voltage VDD, the reference voltage VBB, and the output voltage OUT. As illustrated in FIG. 6, the keeper circuit 640 includes a transistor TN2 and an inverter 641. A first terminal of the transistor TN2 is coupled to the node NP1, a second terminal of the transistor TN2 receives the reference voltage VBB, and a control terminal of the transistor TN2 receives the output voltage OUT. In other words, the transistor TN2 is controlled to be turned on or off by the output voltage OUT. The inverter 641 generates the output voltage OUT according to the node voltage ZPO, the reference voltage VDD, and the reference voltage VBB. In other words, the inverter 641 inverts the node voltage ZPO. As illustrated in FIG. 6, the inverter 641 includes a transistor TP5 and a transistor TN5. A first terminal of the transistor TP5 receives the reference voltage VDD, a second terminal of the transistor TP5 is coupled to a first terminal of the transistor TN5, and a control terminal of the transistor TP5 receives the node voltage ZPO. A second terminal of the transistor TN5 receives the reference voltage VBB, and a control terminal of the transistor TN5 receives the node voltage ZPO. In other words, the transistor TP5 and the transistor TN5 are controlled to be turned on or off by the node voltage ZPO to generate the output voltage OUT. In this example, the transistor TP5 is implemented by a P-type transistor, and the transistor TN2 and the transistor TN5 are implemented by N-type transistors.

Figure 7:
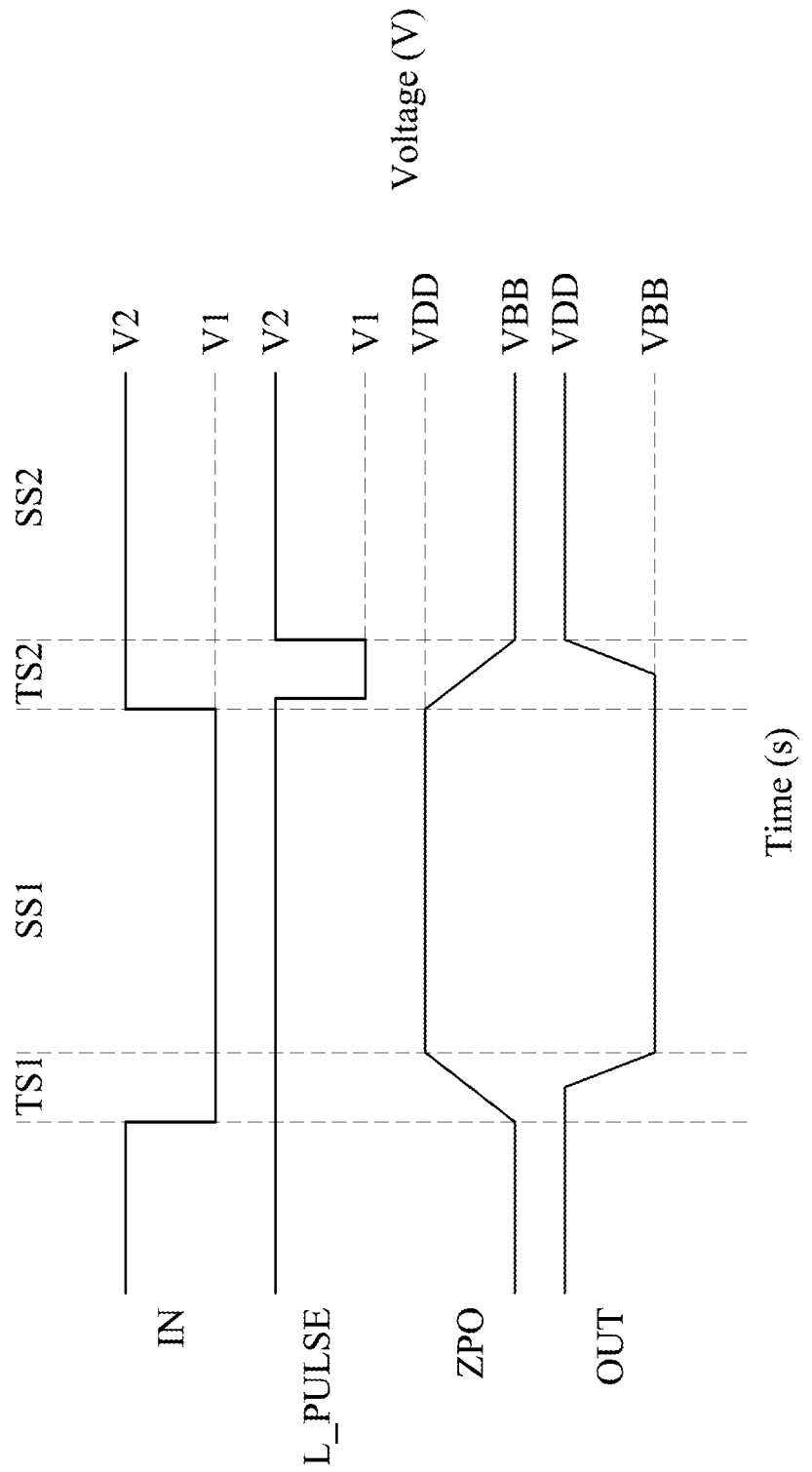
FIG. 7 is a waveform diagram illustrating voltages in the voltage level shifter in FIG. 6 according to some embodiments of the present disclosure.

References are made to FIG. 6 and FIG. 7. FIG. 7 is a waveform diagram illustrating voltages in the voltage level shifter 600 in FIG. 6 according to some embodiments of the present disclosure.

As illustrated in FIG. 7, before a transition duration TS1, the output voltage OUT is at the reference voltage VDD, and the transistor TN2 is turned on according to the control of the output voltage OUT. The transistor TN2 conducts the reference voltage VBB, and thus the node voltage ZPO is at the reference voltage VBB, so as to turn on the transistor TP5 to keep the output voltage OUT at the reference voltage VDD. In addition, before the transition duration TS1, the input voltage IN is at the voltage V2 and the transistor TP0 is turned off, and thus the node voltage ZPO can be kept at the reference voltage VBB to keep the output voltage OUT at the reference voltage VDD. The transistor TN2 is turned on by the output voltage OUT.

Then, in the transition duration TS1 (i.e. the reset circuit 630 is disabled), the input voltage IN decreases from the voltage V2 to the voltage V1. The input transistor TP0 is turned on by the input voltage IN. Since the transistor TN2 and the input transistor TP0 are turned on, there is a pull-up/pull down fighting path FP3 between the transistor TP0 and the transistor TN2. The input transistor TP0 can be designed to be stronger than the transistor TN2. To be more specific, in some embodiments, a channel width to channel length ratio of the input transistor TP0 is designed to be larger than a channel width to channel length ratio of the transistor TN2. For example, the channel width to channel length ratio of the input transistor TP0 can be 2-6 times of the channel width to channel length ratio of the transistor TN2. In some other embodiments, a thickness of the gate oxide of the TP0 is designed to be thinner than a thickness of the gate oxide of the TN2. Since the input transistor TP0 is turned on by the input voltage IN, the node voltage ZPO is rapidly pulled up by the reference voltage VDD through the turned-on input transistor TP0. Accordingly, the output voltage OUT generated by the inverter 641 is rapidly pulled down by the reference voltage VBB.

In a stable duration SS1, when the output voltage OUT decreases to the reference voltage VBB, the transistor TN2 is rapidly turned off and there is no quiescent current flowing through the pull-up/pull-down fighting path FP3. Thus, the node voltage ZPO is kept at the reference voltage VDD, and the input voltage IN is kept at the voltage V1, so that the pulse voltage L_PULSE which is a result of the NAND operation on the input voltage IN with the voltage V1 and the node voltage ZPO with the reference voltage VDD is kept at the voltage V2. Since the pulse voltage L_PULSE is kept at the voltage V2, the transistor TN1 is turned on and the transistor TP1 is turned off. The turned-on transistor TN1 conducts the reference voltage VBB to turn off the transistor TN0. Thus, the node voltage ZPO is not pulled down to reference voltage VBB through the transistor TN0. Accordingly, the node voltage ZPO is kept at the reference voltage VDD, and the output voltage OUT is kept at the reference voltage VBB.

In a transition duration TS2 (i.e. the reset circuit 630 is enabled), the input voltage IN increases from the voltage V1 to the voltage V2. Since the input voltage IN and the node voltage ZPO have the high logic level at the beginning of the transition duration TS2, the pulse voltage L_PULSE decreases from the voltage V2 to the voltage V1 to turn on the transistor TP1 and there is a pull-up/pull-down fighting path FP4 between the transistor TP1 and the transistor TN1. The input transistor TP1 can be designed to be stronger than the transistor TN1. To be more specific, in some embodiments, a channel width to channel length ratio of the input transistor TP1 is designed to be larger than a channel width to channel length ratio of the transistor TN1. For example, the channel width to channel length ratio of the input transistor TP1 can be 2-6 times of the channel width to channel length ratio of the transistor TN1. In some other embodiments, a thickness of the gate oxide of the TP1 is designed to be thinner than a thickness of the gate oxide of the TN1. Thus, the second terminal of the transistor TP1 is rapidly pulled up by the reference voltage VDD through the turned-on transistor TP1. Since the second terminal of the transistor TP1 (e.g., the control terminal of the transistor TN0) is rapidly pulled up, the transistor TN0 is rapidly turned on and the node voltage ZPO is rapidly pulled down by the reference voltage VBB through the turned-on transistor TN0. Accordingly, the output voltage OUT generated by the inverter 641 is rapidly pulled up by the reference voltage VDD.

In a stable duration SS2, when the node voltage ZPO decreases to the reference voltage VBB, the pulse voltage L_PULSE rapidly increases from the voltage V1 to the voltage V2 to turn off the transistor TP1 and there is no current flowing through the pull-up/pull-down fighting path FP4. The transistor TN1 is turned on according to the pulse voltage L_PULSE which is at the voltage V2 to conduct the reference voltage VBB to turn off the transistor TN0. Thus, the input voltage IN is kept at the voltage V2, the pulse voltage L_PULSE is kept at the voltage V2, the node voltage ZPO is kept at the reference voltage VBB, and the output voltage OUT is kept at the reference voltage VDD.

Figure 8:
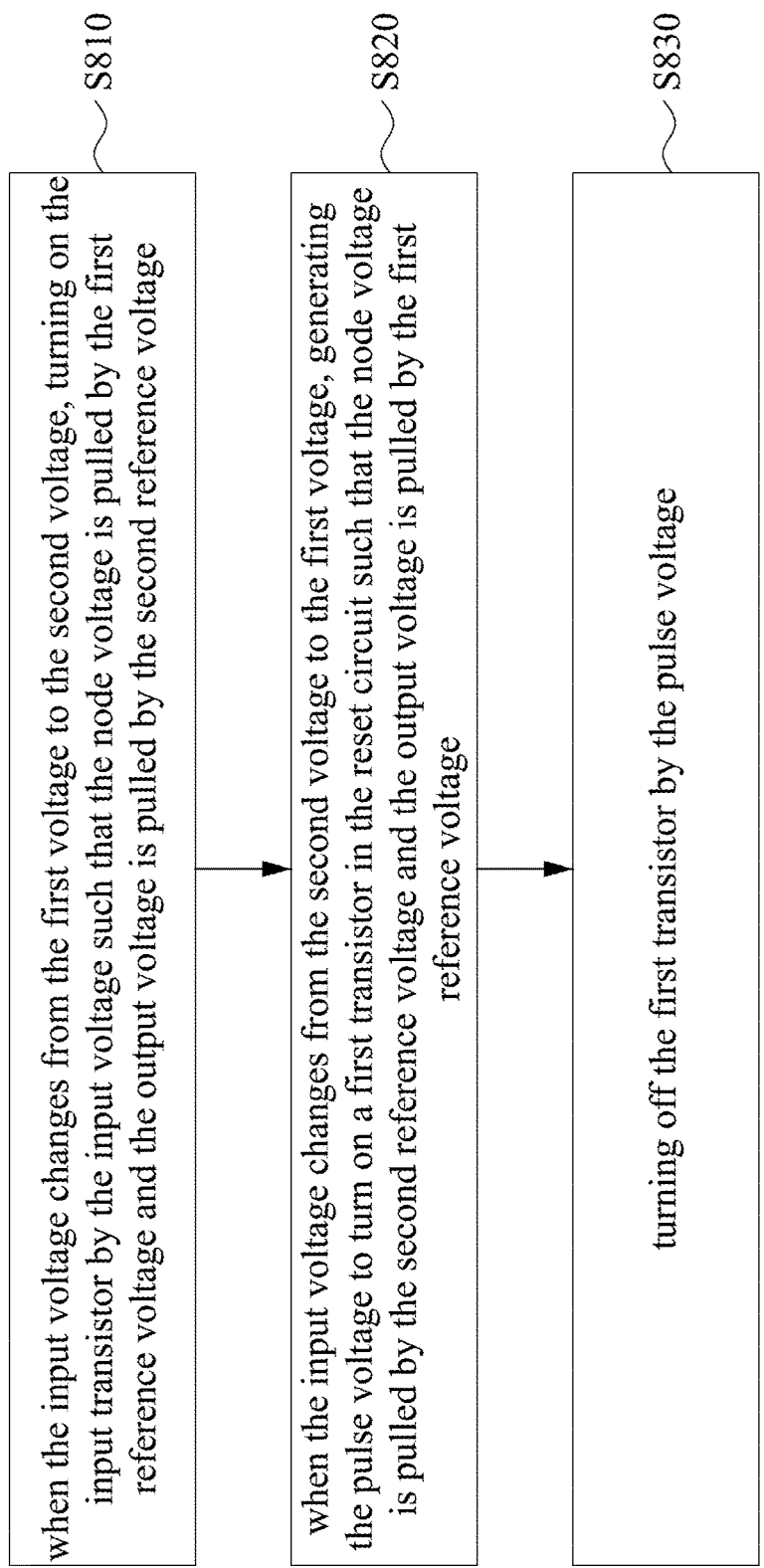
FIG. 8 is a flow diagram illustrating an operation method according to some embodiments of the present disclosure.

Reference is made to FIG. 8. FIG. 8 is a flow diagram illustrating an operation method 800 according to some embodiments of the present disclosure.

As illustrated in FIG. 8, the operation method 800 includes operations S810, S820, and S830. In some embodiments, the operation method 800 can be applied to the voltage level shifter 100, 300, 400, 500, or 600. For better understanding, the operation method 800 is described below with reference to the voltage level shifter 100 in FIG. 1.

In operation S810, when the input voltage IN changing from the voltage V1 to the voltage V2, the input transistor MN0 is turn on by the input voltage IN. Thus, the node voltage ZPO is pulled down by the ground voltage GND through the turned-on input transistor MN0 and the output voltage OUT is pulled up by the power voltage VHIGH.

In operation S820, when the input voltage IN changes from the voltage V2 to the voltage V1, the pulse voltage H_PULSE is generated to turn on the transistor MN1 in the reset circuit 130. Thus, the node voltage ZPO is pulled up by the power voltage VHIGH through the turned-on transistor MP1 and the output voltage OUT is pulled down by the ground voltage GND.

In operation S830, when the node voltage ZPO is pulled up to the power voltage VHIGH, the pulse voltage H_PULSE has the low logic value to turn off the transistor MN1.

Based on the descriptions above, in the present disclosure, both of the transition speed of the output voltage from the high logic level to the low logic level and the transition speed of the output voltage from the low logic level to the high logic level are fast.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A voltage level shifter, comprising:
   an input transistor configured to receive an input voltage and a first reference voltage;
   a control circuit configured to generate a pulse voltage according to the input voltage and one of a node voltage, an output voltage, and an inversion input voltage;
   a reset circuit configured to receive the first reference voltage and a second reference voltage and controlled by the pulse voltage to be disabled when the input voltage changes from a first voltage to a second voltage such that the node voltage changes from the second reference voltage to the first reference voltage, and controlled by the pulse voltage to be enabled when the input voltage changes from the second voltage to the first voltage such that the node voltage changes from the first reference voltage to the second reference voltage, wherein the reset circuit is coupled to the input transistor at a first node where the node voltage is generated; and
   a keeper circuit coupled to the first node and configured to generate the output voltage according to the node voltage, the first reference voltage, the second reference voltage, and the output voltage,
   wherein the reset circuit comprises:
      a first transistor configured to receive the first reference voltage and controlled by the pulse voltage;
      a second transistor configured to receive the second reference voltage, coupled to the first transistor, and controlled by the pulse voltage; and
      a third transistor configured to receive the second reference voltage and coupled to the input transistor, and controlled by a voltage at a second node between the first transistor and the second transistor.

2. The voltage level shifter of claim 1, wherein the first reference voltage is lower than the second reference voltage.

3. The voltage level shifter of claim 2, wherein the control circuit comprises:
   a NOR gate configured to generate the pulse voltage according to the input voltage and the node voltage.

4. The voltage level shifter of claim 1, wherein the keeper circuit comprises:
   a fourth transistor configured to receive the second reference voltage, coupled to the first node, and controlled by the output voltage; and an inverter configured to invert the node voltage to generate the output voltage.

5. The voltage level shifter of claim 4, wherein the input transistor and the first transistor are implemented by N-type transistors, and the second transistor, the third transistor, and the fourth transistor are implemented by P-type transistors.

6. The voltage level shifter of claim 4, wherein a channel width to channel length ratio of the input transistor is larger than a channel width to channel length ratio of the fourth transistor.

7. The voltage level shifter of claim 4, wherein a channel width to channel length ratio of the first transistor is larger than a channel width to channel length ratio of the second transistor.

8. The voltage level shifter of claim 1, wherein the reset circuit further comprises:
a fourth transistor coupled between the first transistor and the second transistor; and
a fifth transistor coupled between the third transistor and the input transistor,
wherein the fourth transistor and the fifth transistor are controlled by a bias voltage.

9. An operation method for the voltage level shifter of claim 1, comprising:
when the input voltage changes from the first voltage to the second voltage, turning on the input transistor by the input voltage such that the node voltage is pulled by the first reference voltage and the output voltage is pulled by the second reference voltage;
when the input voltage changes from the second voltage to the first voltage, generating the pulse voltage to turn on the first transistor in the reset circuit such that the node voltage is pulled by the second reference voltage and the output voltage is pulled by the first reference voltage; and
turning off the first transistor by the pulse voltage.

10. The operation method of claim 9,
wherein the keeper circuit comprises:
a fourth transistor configured to receive the second reference voltage, coupled to the first node, and controlled by the output voltage; and
an inverter configured to invert the node voltage to generate the output voltage,
wherein a channel width to channel length ratio of the input transistor is larger than a channel width to channel length ratio of the fourth transistor.

11. The operation method of claim 9,
wherein the keeper circuit comprises:
a fourth transistor configured to receive the second reference voltage, coupled to the first node, and controlled by the output voltage; and
an inverter configured to invert the node voltage to generate the output voltage,
wherein a channel width to channel length ratio of the first transistor is larger than a channel width to channel length ratio of the second transistor.

12. A voltage level shifter, comprising:
an input transistor configured to receive an input voltage and a first reference voltage;
a control circuit configured to generate a pulse voltage according to the input voltage and one of a node voltage, an output voltage, and an inversion input voltage;
a reset circuit configured to receive the first reference voltage and a second reference voltage and controlled by the pulse voltage to be disabled when the input voltage changes from a first voltage to a second voltage such that the node voltage changes from the second reference voltage to the first reference voltage, and controlled by the pulse voltage to be enabled when the input voltage changes from the second voltage to the first voltage such that the node voltage changes from the first reference voltage to the second reference voltage, wherein the reset circuit is coupled to the input transistor at a first node where the node voltage is generated; and
a keeper circuit coupled to the first node and configured to generate the output voltage according to the node voltage, the first reference voltage, the second reference voltage, and the output voltage,
wherein the first reference voltage is lower than the second reference voltage,
wherein the control circuit comprises:
an inverter configured to generate an inversion output voltage according to the output voltage; and
a NOR gate configured to generate the pulse voltage according to the input voltage and the inversion output voltage.

13. A voltage level shifter, comprising:
an input transistor configured to receive an input voltage and a first reference voltage;
a control circuit configured to generate a pulse voltage according to the input voltage and one of a node voltage, an output voltage, and an inversion input voltage;
a reset circuit configured to receive the first reference voltage and a second reference voltage and controlled by the pulse voltage to be disabled when the input voltage changes from a first voltage to a second voltage such that the node voltage changes from the second reference voltage to the first reference voltage, and controlled by the pulse voltage to be enabled when the input voltage changes from the second voltage to the first voltage such that the node voltage changes from the first reference voltage to the second reference voltage, wherein the reset circuit is coupled to the input transistor at a first node where the node voltage is generated; and
a keeper circuit coupled to the first node and configured to generate the output voltage according to the node voltage, the first reference voltage, the second reference voltage, and the output voltage,
wherein the first reference voltage is lower than the second reference voltage,
wherein the control circuit is a pulse generator and the pulse generator comprises:
a plurality of inverters configured to generate the inversion input voltage according to the input voltage; and
a NOR gate configured to generate the pulse voltage according to the input voltage and the inversion input voltage.

14. The voltage level shifter of claim 13, further comprising:
a reset transistor configured to receive the second reference voltage, coupled to the first node, and controlled by a reset signal.

15. A voltage level shifter, comprising:
an input transistor configured to receive an input voltage and a first reference voltage;
a control circuit configured to generate a pulse voltage according to the input voltage and one of a node voltage, an output voltage, and an inversion input voltage;

a reset circuit configured to receive the first reference voltage and a second reference voltage and controlled by the pulse voltage to be disabled when the input voltage changes from a first voltage to a second voltage such that the node voltage changes from the second reference voltage to the first reference voltage, and controlled by the pulse voltage to be enabled when the input voltage changes from the second voltage to the first voltage such that the node voltage changes from the first reference voltage to the second reference voltage, wherein the reset circuit is coupled to the input transistor at a first node where the node voltage is generated; and a keeper circuit coupled to the first node and configured to generate the output voltage according to the node voltage, the first reference voltage, the second reference voltage, and the output voltage, wherein the first reference voltage is higher than the second reference voltage.

16. The voltage level shifter of claim 15, wherein the control circuit comprises:

a NAND gate configured to generate the pulse voltage according to the input voltage and the node voltage.

17. The voltage level shifter of claim 15, wherein the reset circuit comprises:

a first transistor configured to receive the first reference voltage and controlled by the pulse voltage;

a second transistor configured to receive the second reference voltage, coupled to the first transistor, and controlled by the pulse voltage; and a third transistor configured to receive the second reference voltage, coupled to the input transistor, and controlled by a drain voltage of the first transistor.

18. The voltage level shifter of claim 17, wherein the keeper circuit comprises:

a fourth transistor configured to receive the second reference voltage, coupled to the first node, and controlled by the output voltage; and an inverter configured to invert the node voltage to generate the output voltage.

19. The voltage level shifter of claim 18, wherein the input transistor and the first transistor are implemented by P-type transistors, and the second transistor, the third transistor, and the fourth transistor are implemented by N-type transistors.

* * * * *